(12) United States Patent
White et al.

(10) Patent No.: US 8,004,293 B2
(45) Date of Patent: Aug. 23, 2011

(54) PLASMA PROCESSING CHAMBER WITH GROUND MEMBER INTEGRITY INDICATOR AND METHOD FOR USING THE SAME

(75) Inventors: John M. White, Hayward, CA (US); Carl Sorensen, Morgan Hill, CA (US)

(73) Assignee: Applied Materials, Inc., Santa Clara, CA (US)

( * ) Notice: Subject to any disclaimer, the term of this patent is extended or adjusted under 35 U.S.C. 154(b) by 640 days.

(21) Appl. No.: 11/561,463

(22) Filed: Nov. 20, 2006

(65) Prior Publication Data
US 2008/0116876 A1    May 22, 2008

(51) Int. Cl.
G01R 27/08    (2006.01)
G01R 31/08    (2006.01)
(52) U.S. Cl. ........................ 324/713; 324/522
(58) Field of Classification Search .............. 324/713, 324/691, 649, 600
See application file for complete search history.

(56) References Cited

U.S. PATENT DOCUMENTS

| | | | |
|---|---|---|---|
| 4,771,230 A * | 9/1988 | Zeh ............................. | 324/459 |
| 5,423,936 A | 6/1995 | Tomita et al. | |
| 5,558,717 A | 9/1996 | Zhao et al. | |
| 5,900,062 A | 5/1999 | Loewenhardt et al. | |
| 5,900,064 A | 5/1999 | Kholodenko | |
| 6,012,600 A | 1/2000 | Pham et al. | |
| 6,024,044 A | 2/2000 | Law et al. | |
| 6,057,235 A | 5/2000 | Leiphart et al. | |
| 6,129,808 A | 10/2000 | Wicker et al. | |
| 6,221,221 B1 | 4/2001 | Al-Shaikh et al. | |
| 6,254,746 B1 | 7/2001 | Subramanl et al. | |
| 6,345,589 B1 | 2/2002 | Ramiah et al. | |
| 6,349,670 B1 | 2/2002 | Nakano et al. | |
| 6,364,958 B1 | 4/2002 | Lai et al. | |
| 6,511,577 B1 | 1/2003 | Johnson | |
| 6,531,030 B1 | 3/2003 | Nakajima | |
| 6,652,713 B2 | 11/2003 | Brown et al. | |
| 6,726,805 B2 | 4/2004 | Brown et al. | |
| 6,777,949 B2 * | 8/2004 | Tsuji et al. ................... | 324/501 |
| 6,779,481 B2 | 8/2004 | Kent et al. | |
| 6,815,369 B2 * | 11/2004 | Suzuki ......................... | 438/758 |
| 6,857,387 B1 | 2/2005 | Sun et al. | |

(Continued)

FOREIGN PATENT DOCUMENTS

EP    1030345    8/2000

(Continued)

OTHER PUBLICATIONS

Office Action dated Jan. 28, 2009 for Korean Patent Application No. 10-2007-0106554.

(Continued)

*Primary Examiner* — Hoai-An D Nguyen
(74) *Attorney, Agent, or Firm* — Patterson & Sheridan, L.L.P.

(57) ABSTRACT

A method and apparatus for monitoring the integrity of a ground member coupling a substrate support to a chamber body in a plasma processing system is provided. In one embodiment, a processing chamber is provided that includes a ground path member coupled between a substrate support and a chamber body. A sensor is positioned to sense a metric indicative of current passing through the ground member. In another embodiment, a method monitoring the integrity of a ground member coupling a substrate support to a chamber body in a plasma processing chamber includes monitoring a metric indicative of current passing through the ground member during processing, and setting a flag in response to the metric exceeding a predefined threshold.

25 Claims, 5 Drawing Sheets

U.S. PATENT DOCUMENTS

| | | |
|---|---|---|
| 7,083,702 B2 * | 8/2006 | Blonigan et al. ......... 156/345.47 |
| 7,202,690 B2 * | 4/2007 | Yamamoto et al. ........... 324/763 |
| 2003/0029564 A1 | 2/2003 | Brown et al. |
| 2003/0047281 A1 | 3/2003 | Hirose et al. |
| 2003/0079691 A1 | 5/2003 | Shang et al. |
| 2005/0263070 A1 * | 12/2005 | Fink ............................. 118/715 |
| 2006/0017452 A1 | 1/2006 | Yamamoto et al. |
| 2006/0060302 A1 * | 3/2006 | White et al. ............. 156/345.28 |
| 2006/0066247 A1 * | 3/2006 | Koshiishi et al. ........ 315/111.21 |
| 2006/0171848 A1 * | 8/2006 | Roche et al. .................... 422/98 |
| 2007/0035908 A1 * | 2/2007 | Kitsunai et al. ............... 361/234 |

FOREIGN PATENT DOCUMENTS

| | | |
|---|---|---|
| KR | 10-0264445 | 11/2000 |

OTHER PUBLICATIONS

Office Office dated Jul. 24, 2009 for Chinese Patent Application No. 2007101653378.

* cited by examiner

PLASMA PROCESSING CHAMBER WITH GROUND MEMBER INTEGRITY INDICATOR AND METHOD FOR USING THE SAME

BACKGROUND OF THE INVENTION

1. Field of the Invention

The embodiments of the invention generally relate to a method and apparatus for plasma processing a substrate, and more specifically, plasma processing chamber having a ground member integrity indicator and method for using the same.

2. Description of the Related Art

Liquid crystal displays or flat panels are commonly used for active matrix displays such as computer and television monitors. Generally, flat panels comprise two plates having a layer of liquid crystal material sandwiched therebetween. At least one of the plates includes at least one conductive film disposed thereon that is coupled to a power source. Power, supplied to the conductive film from the power supply, changes the orientation of the crystal material, creating a patterned display.

In order to manufacture these displays, a substrate, such as a glass or polymer workpiece, is typically subjected to a plurality of sequential processes to create devices, conductors and insulators on the substrate. Each of these processes is generally performed in a process chamber configured to perform a single step of the production process. In order to efficiently complete the entire sequence of processing steps, a number of process chambers are typically coupled to a central transfer chamber that houses a robot to facilitate transfer of the substrate between the process chambers. A processing platform having this configuration is generally known as a cluster tool, examples of which are the families of AKT plasma enhanced chemical vapor deposing (PECVD) processing platforms available from AKT America, Inc., of Santa Clara, Calif.

As demand for flat panels has increased, so has the demand for larger sized substrates. For example, large area substrates utilized for flat panel fabrication have increased in area from 550 mm by 650 mm to over 2 square meters in just a few years and are envisioned to continue to increase in size in the near future. This growth in the size of the large area substrates has presented new challenges in handling and production. For example, the larger surface area of the substrates requires increased grounding capacity of the substrate supports. On conventional systems, a plurality of flexible conductive straps provides a ground path between the substrate support and chamber body. Since the ground straps are not readily visible from the exterior of the processing chamber, operators are often unaware if one or more straps are broken. If enough straps are broken, processing results may no be within specification, resulting in defects. Although breakage of one strap is not a catastrophic event, strap breakage does affects process uniformity, and as such, the inventors have recognized that would be desirable to be monitor the effectiveness of the substrate support ground in order to maintain robust processing.

Therefore, there is a need for an improved plasma processing chamber having a ground member integrity indicator and method for using the same.

SUMMARY OF THE INVENTION

A method and apparatus for monitoring the integrity of a ground member coupling a substrate support to ground, such as a grounded chamber body, in a plasma processing system is provided. In one embodiment, a processing chamber is provided that includes a ground path member coupled between a substrate support and a chamber body. A sensor is positioned to sense a metric indicative of current passing through the ground member.

In another embodiment, a processing chamber includes a plurality of ground straps coupled between a substrate support and a chamber body. A plurality of sensors is provided. The sensors are positioned to sense a metric indicative of strap integrity for a respective one of the ground straps.

In another embodiment, a method monitoring the integrity of a ground member coupling a substrate support to a chamber body in a plasma processing chamber includes monitoring a metric indicative of current passing through the ground member during processing, and setting a flag in response to the metric exceeding a predefined threshold.

In yet another embodiment, a method for processing a substrate includes plasma processing a substrate disposed on a substrate support in a vacuum processing chamber, and monitoring continuity of a ground member coupling the substrate support to ground during processing.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

To facilitate understanding, identical reference numerals have been used, where possible, to designate identical elements that are common to the figures. It is to be noted, however, that the appended drawings illustrate only typical embodiments of this invention and are therefore not to be considered limiting of its scope, for the invention may admit to other equally effective embodiments.

DETAILED DESCRIPTION

The invention generally relates to a plasma processing chamber and a method for monitoring the integrity of a ground member coupling a substrate support to a chamber body in a plasma processing system. Although the invention is illustratively described, shown and practiced within a large area substrate processing system, the invention may find utility in other plasma processing chambers where it is desirable to ensure that one or more ground paths remain functioning at a level that facilitates acceptable processing within the chamber.

Figure 1:
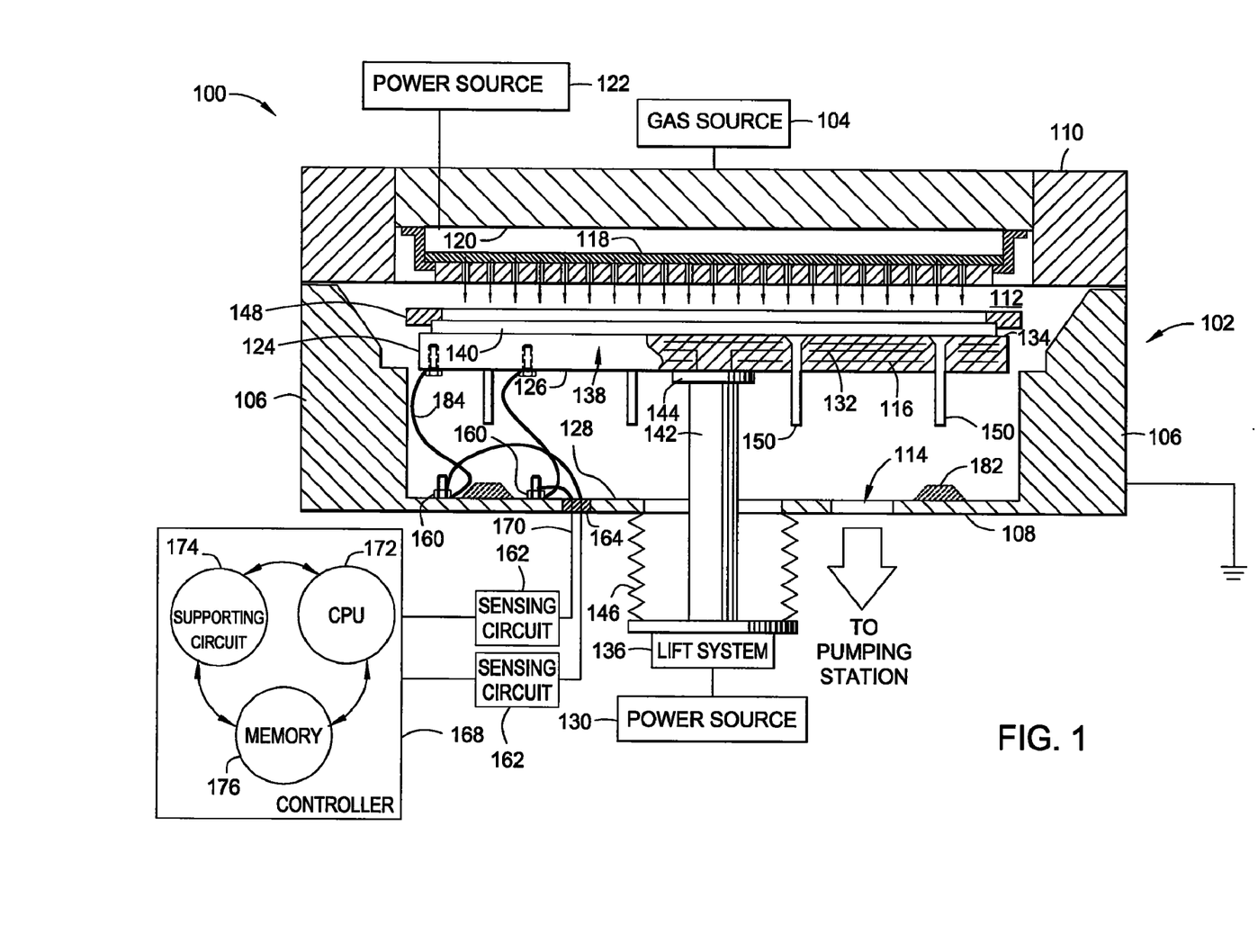
FIG. 1 is a cross sectional view of one embodiment of a plasma enhanced chemical vapor deposition system having a dechucking circuit.

FIG. 1 is a cross sectional view of one embodiment of a plasma enhanced chemical vapor deposition system 100 having one embodiment of a ground path integrity sensor 160. The ground path integrity sensor 160 facilitates monitoring the effectiveness of a ground path coupled between a substrate support assembly 138 and a chamber body 102. It is contemplated that embodiments of the ground path integrity sensor 160 and method for using the same described herein, along with derivations thereof, may be utilized in other processing systems, including those from other manufacturers.

In the embodiment depicted in FIG. 1, the grounded chamber body 102 has a gas source 104, a power source 122 and a controller 168 coupled thereto. The controller 168 is utilized to control the processes performed in the system 100 and interfaces with the sensor 160. In one embodiment, the controller 168 includes a central processing unit (CPU) 172, support circuits 174 and memory 176, is coupled to the polisher 100. The CPU 172 may be one of any form of computer processor that can be used in an industrial setting for controlling various chambers and subprocessors. The memory 176 is coupled to the CPU 172. The memory 176, or computer-readable medium, may be one or more of readily available memory such as random access memory (RAM), read only memory (ROM), floppy disk, hard disk, or any other form of digital storage, local or remote. The support circuits 174 are coupled to the CPU 172 for supporting the processor in a conventional manner. These circuits include cache, power supplies, clock circuits, input/output circuitry, subsystems, and the like.

The chamber body 102 has sidewalls 106, a bottom 108, and a lid assembly 110 that define a process volume 112. The process volume 112 is typically accessed through a port (not shown) in the sidewall 106 that facilitates movement of a large area substrate 140 (hereinafter referred to as "substrate 140") into and out of the chamber body 102. The large area substrate 140 may be a glass or polymer workpiece, and in one embodiment has a plan surface area greater than about 0.25 meters. The sidewalls 106 and bottom 108 of the chamber body 102 are typically fabricated from a unitary block of aluminum or other material compatible with process chemistries. The bottom 108 of the chamber body 102 has a pumping port 114 formed therethrough that couples the process volume 112 to a pumping system (not shown) to facilitate control of pressure within the process volume 112 and exhaust gases and byproducts during processing.

The lid assembly 110 is supported by the sidewalls 106 and can be removed to service the interior of the chamber body 102. The lid assembly 110 is generally comprised of aluminum. A distribution plate 118 is coupled to an interior side 120 of the lid assembly 110. The distribution plate 118 is typically fabricated from aluminum. The center section of the distribution plate 118 includes a perforated area through which process and other gases supplied from the gas source 104 are delivered to the process volume 112. The perforated area of the distribution plate 118 is configured to provide a uniform distribution of gases passing through the distribution plate 118 into the chamber body 102. The power source 122 is coupled to the distribution plate 118 to provide an electrical bias that energizes the process gas and sustains a plasma formed from process gas in the interior volume 112 below the gas distribution plate 118 during processing.

The heated substrate support assembly 138 is centrally disposed within the chamber body 102 and supports the substrate 140 during processing. The substrate support assembly 138 generally includes an electrically conductive body 124 supported by a shaft 142 that extends through the chamber bottom 108. The support body 124 is generally polygonal in shape and covered with an electrically insulative coating (not shown) over at least the portion of the body 124 that supports the substrate 140. The coating may also cover other portions of the body 124. The substrate support assembly 138 is normally coupled to ground at least during processing.

The support body 124 may be fabricated from metals or other comparably electrically conductive materials. The insulative coating may be a dielectric material such as an oxide, silicon nitride, silicon dioxide, aluminum dioxide, tantalum pentoxide, silicon carbide or polyimide, among others, which may be applied by various deposition or coating processes, including, but not limited to, flame spraying, plasma spraying, high energy coating, chemical vapor deposition, spraying, adhesive film, sputtering and encapsulating.

In one embodiment, the aluminum body 124 encapsulates at least one embedded heating element 132 and a thermocouple (not shown). The body 124 may include one or more stiffening members (not shown) comprised of metal, ceramic or other stiffening materials embedded therein.

The heating element 132, such as an electrode or resistive element, is coupled to a power source 130 and controllably heats the support assembly 138 and substrate 140 positioned thereon to a predetermined temperature. Typically, the heating element 132 maintains the substrate 140 at a uniform temperature of about 150 to at least about 460 degrees Celsius during processing. The heating element 132 is electrically floating relative to the body 124.

Generally, the support assembly 138 has a lower side 126 and an upper side 134 that supports the substrate 140 thereon. The lower side 126 has a stem cover 144 coupled thereto. The stem cover 144 generally is an aluminum ring coupled to the support assembly 138 that provides a mounting surface for the attachment of the shaft 142 thereto.

Generally, the shaft 142 extends from the stem cover 144 through the chamber bottom 108 and couples the support assembly 138 to a lift system 136 that moves the support assembly 138 between an elevated process position (as shown) and a lowered position that facilitates substrate transfer. A bellows 146 provides a vacuum seal between the processing volume 112 and the atmosphere outside the chamber body 102 while facilitating the vertical movement of the support assembly 138. The shaft 142 additionally provides a conduit for electrical and thermocouple leads between the support assembly 138 and other components of the system 100.

The shaft 142 may be electrically isolated from the chamber body 102. In the embodiment depicted in FIG. 1, a dielectric isolator 128 is disposed between the shaft 142 and chamber body 102. The isolator 128 may additionally support or be configured to function as a bearing for the shaft 142.

The support assembly 138 additionally supports a circumscribing shadow frame 148. Generally, the shadow frame 148 prevents deposition at the edge of the substrate 140 and support assembly 138 so that the substrate 140 does not stick to the support assembly 138.

The support assembly 138 has a plurality of holes disposed therethrough that accept a plurality of lift pins 150. The lift pins 150 are typically comprised of ceramic or anodized aluminum and have first ends that are substantially flush with or slightly recessed from the upper side 134 of the support assembly 138 when the lift pins 150 are in a normal position (i.e., retracted relative to the support assembly 138). As the support assembly 138 is lowered to a transfer position, the lift pins 150 come in contact with the bottom 108 of the chamber body 102 and are displaced through the support assembly 138 to project from the upper side 134 of the support assembly 138, thereby placing the substrate 140 in a spaced-apart relation to the support assembly 138.

In one embodiment, lift pins 150 of varying lengths (as shown in FIG. 1) are utilized so that they come into contact with the bottom 108 and are actuated at different times. For example, the lift pins 150 that are spaced around the outer edges of the substrate 140, combined with relatively shorter lift pins 150 spaced inwardly from the outer edges toward the center of the substrate 140, allow the substrate 140 to be first lifted from its outer edges relative to its center. In another embodiment, lift pins 150 of a uniform length may be utilized in cooperation with bumps or plateaus 182 (shown in phantom) positioned beneath the outer lift pins 150, so that the outer lift pins 150 are actuated before and displace the substrate 140 a greater distance from the upper surface 134 than the inner lift pins 150. Alternatively, the chamber bottom 108 may comprise grooves or trenches positioned beneath the inner lift pins 150, so that the inner lift pins 150 are actuated after and displaced a shorter distance than the outer lift pins 150. Embodiments of a system having lift pins configured to lift a substrate in an edge to center manner from a substrate support that may be adapted to benefit from the invention are described in U.S. patent application Ser. No. 10/308,385 filed Dec. 2, 2002 by Shang, et al., and described in U.S. patent application Ser. No. 10/460,196 filed Jun. 12, 2003 by Blonigan, et al., both of which are hereby incorporated by reference in there entireties.

The support assembly 138 is generally grounded during processing such that an RF power supplied by the power source 122 to the distribution plate 118 (or other electrode positioned within or near the lid assembly 110 of the chamber body 102) may excite the gases disposed within the process volume 112 between the support assembly 138 and the distribution plate 118. The RF power from the power source 122 is generally selected commensurate with the size of the substrate 140 to drive the chemical vapor deposition process.

In one embodiment, the substrate support assembly 138 is grounded by one or more RF ground return path members 184 that provide a low-impedance RF return path between the support body 124 and ground. The RF ground return path members 184 may be coupled directly or indirectly to ground, for example, through the chamber body 102.

In one embodiment, the RF ground return path members 184 are a plurality of flexible straps (two of which are shown in FIG. 1) coupled between a perimeter of the body 124 and the chamber bottom 108. The RF ground return path members 184 may be fabricated from aluminum, beryllium copper or other suitable RF conducting material. For example, four groups of ground path members 184 may be coupled to respective sides of a four-sided substrate support body 124.

At least one ground path integrity sensor 160 is interfaced with the members 184 in a manner that facilitates monitoring whether the member 184 remains suitable for conducting current between the support body 124 and the chamber body 102. A single sensor 160 may be interfaced with one or more individual ground path members 184. Alternatively, each ground path member 184 may be interfaced with a dedicated sensor 160. In the embodiment depicted in FIG. 1, each ground path member 184 is interfaced with a dedicated sensor 160. It is also contemplated that a plurality of sensors 160 may be used, wherein each sensor 160 is interfaced with a predefined grouping of members 184, for example, a first sensor 160 may be interfaced with all the members 184 coupled to a first side of the support body 124, while a second sensor 160 may be interfaced with all the members 184 coupled to a second side of the support body 124. The other sides of the support body 124 may be similarly configured. In the manner, differences in the current flow to ground along different areas of the substrate support may be monitored so that when the ground current flow distribution among the ground path members is outside a predefined limit, a flag may be generated to inform the operator of an out of specification ground condition. The flag may be change the state of an indicator light, trigger an alert or provide other notification to the operators. The flag may also cause the system to reroute substrates within the processing system so that the chamber may be taken out of service for repair/maintenance of the ground path members.

Figure 2:
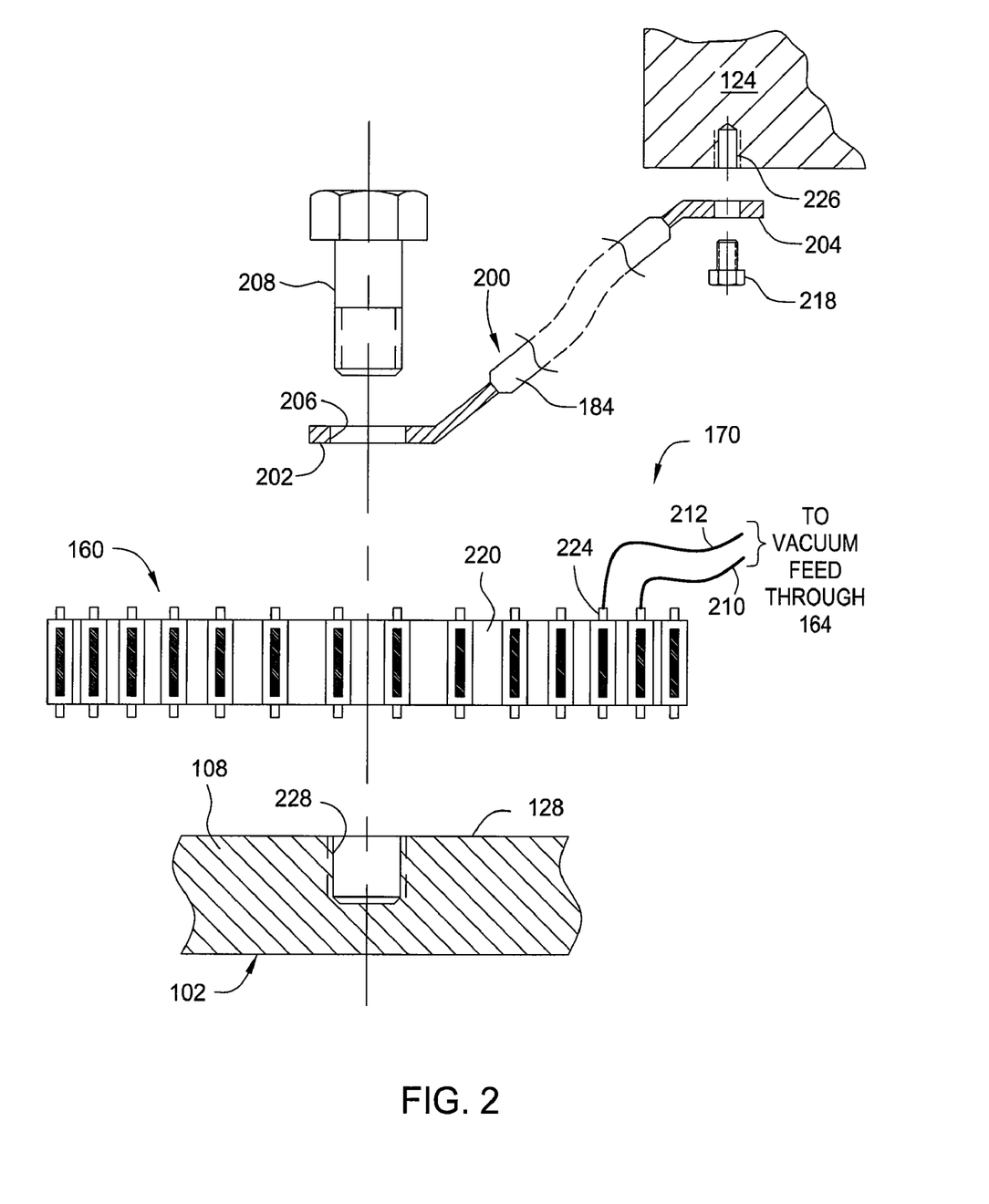
FIG. 2 is a flow diagram of one embodiment of a method for dechucking a substrate.

FIG. 2 depicts an exploded view of one embodiment of the ground path member 184 configured as a flexible strap 200. The strap 200 has sufficient flexibility to allow the substrate support assembly 138 to change elevations, as described with reference to FIG. 1.

Each strap 200 has a first end 202 and a second end 204. The first end 202 is coupled to the support body 124, for example by a fastener, clamp or other method that maintains electrical connection between the body 124 and strap 200. In the embodiment depicted in FIG. 2, a fastener 218 is screwed into a threaded hole 226 to couple the strap 200 to the support body 124. The second end 204 has a terminal 206 coupled thereto that facilitates coupling the strap 200 to the chamber body 102 via a fastener 208 and threaded hole 228. It is contemplated that adhesives, clamps or other methods that maintain electrical connection between the chamber body 102 and strap 200 may be utilized.

The ground path integrity sensor 160 is interfaced with the ground path member 184, e.g., the strap 200, to provide the controller 168 with a metric indicative of the integrity of the strap 200. A ground path member having integrity is defined as the ability of maintain a conductive path between the bodies 102, 124, for example, ground path member having electrical continuity between its ends. Thus, when a member or strap losses its integrity, by disconnection, breakage or other factor, a ground current can no longer flow between the bodies 102, 124 through the member without integrity.

In the embodiment depicted in FIGS. 1-2, the ground path integrity sensor 160 is a current sensor mounted to the bottom 108 of the chamber body 102. It is also contemplated that the ground path integrity sensor 160 may be configured as a resistance sensor or other sensor suitable for determining the ability of the strap to carry current between the bodies 102, 124. The second end 204 of the ground strap 200 passes through the center of the sensor 160. Leads (collectively shown as 170 and individually shown as 210, 212) are coupled to the ground path integrity sensor 160 and exit the chamber body 102 through a vacuum feed through 164. The leads 170 couple the sensor 160 to a sensing circuit 162 disposed outside the processing chamber 100.

In one embodiment of the ground path integrity sensor 160. The ground path integrity sensor 160 includes a dielectric ring 220. The ring 220 may be fabricated from any suitable material, such as ceramic. A plurality of coils 224 are wound around the ring 220 and coupled to the leads 210, 212. The leads 210, 212 are coupled to the sensing circuit 162.

In operation, current passing through the strap 200 causes a small current to be induced in the coils 224. The inducted current is provided from the coils 224 through the leads 170 to the sensing circuit 162. If the strap was to break, become disconnected from at least one of the bodies 102, 124 or otherwise become unable to carry current between the bodies 102, 124, the output of the sensing circuit 162 will indicate the loss and/or change in integrity of the straps.

Moreover, changes in the sensing circuits 162 interfaced with each strap 200 are indicative of changes in the ground current distribution passing from different regions of the substrate support body 124 to the chamber body 102. For example, three ground path integrity sensors 160 interfaced with straps 200 coupled to three different sides of the substrate support body 124 may sense a first distribution of grounding while three ground path integrity sensors 160 may be arranged to interface with straps 200 coupled to the same side of the substrate support body may sense a second distribution of grounding. The distributions of grounding may be compared to a threshold. If the distributions of grounding are within acceptable limits i.e., a predefined combination of straps are conducting a predefined amount of current, then processing may continue. If the distributions of grounding are outside of acceptable limits, a flag may be generated. The current may be analyzed on a strap by strap basis, on a total current basis, or by a current per support region basis, among other criteria. Thus, the ground path integrity sensors 160 may be utilized to determine if the total number of remaining functioning straps 200 and/or if the relative position of remaining functioning straps 200 to each other are within a threshold that will continue to provide desired processing results.

Figure 3:
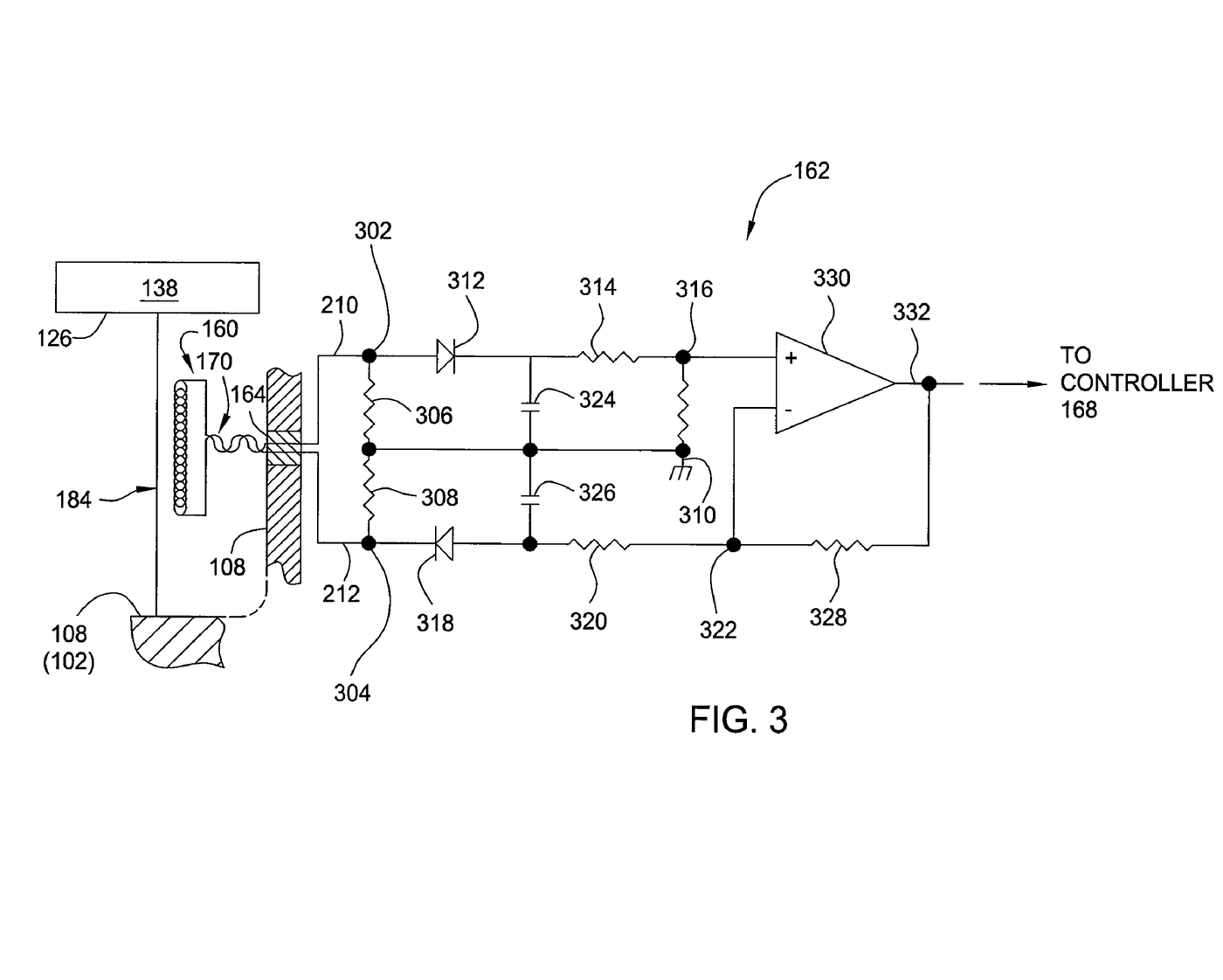
FIG. 3 is a cross sectional view of another embodiment of a plasma enhanced chemical vapor deposition system having a dechucking circuit.

FIG. 3 depicts one embodiment of the sensing circuit 162. The sensing circuit 162 includes first and second terminals 302, 304. The first lead 110 is coupled to the first terminal 302 while the second lead 112 is coupled to the second terminal 304. The first terminal 302 is coupled to a first resistor 306 while the second lead 112 is coupled to the second resistor 308. The first and second resistors 306, 308 are coupled to a center ground tap 310. A first diode 312 is coupled to the first terminal 302. The first diode 312 is also coupled to a third resistor 314. The third resistor 314 is coupled to a first amplifier terminal 316 of an amplifier 330. A second diode 318 is coupled to the second terminal 304. The second diode 318 is also coupled to a fourth resistor 320. The fourth resistor 320 is coupled to a second amplifier terminal 322. A fifth resistor 328 is coupled between the terminal 322 and output 332 of the amplifier 330. The output 332 of the amplifier 330 is coupled to the controller 168.

A first side of a first capacitor 324 is coupled to the diode 312 and resistor 314, while a second side of the capacitor 324 is coupled to the center ground tap 310. A second capacitor 326 is coupled is coupled to the diode 318 and resistor 320, while a second side of the capacitor 326 is coupled to the center ground tap 310.

Thus, as current provided by the leads 210, 212 energizes the resistors 306, 308 and capacitors 324, 326, a control signal is provided to the terminals of the amplifier 330, which outputs a metric indicative of the ground member(s) integrity to the controller 168. The resistive and capacitive values for the components of the sensing circuit 162 may be selected to determine the amplitude of the input current to the amplifier 330. The output 332 of the amplifier 330 is provided to the controller 168 which determine if a flag should be generated from the change in the amplifier output, and from analysis of which sensing circuits 160 (e.g., which straps or group of straps) carry what portion of the substrate support grounding load.

Figure 4:
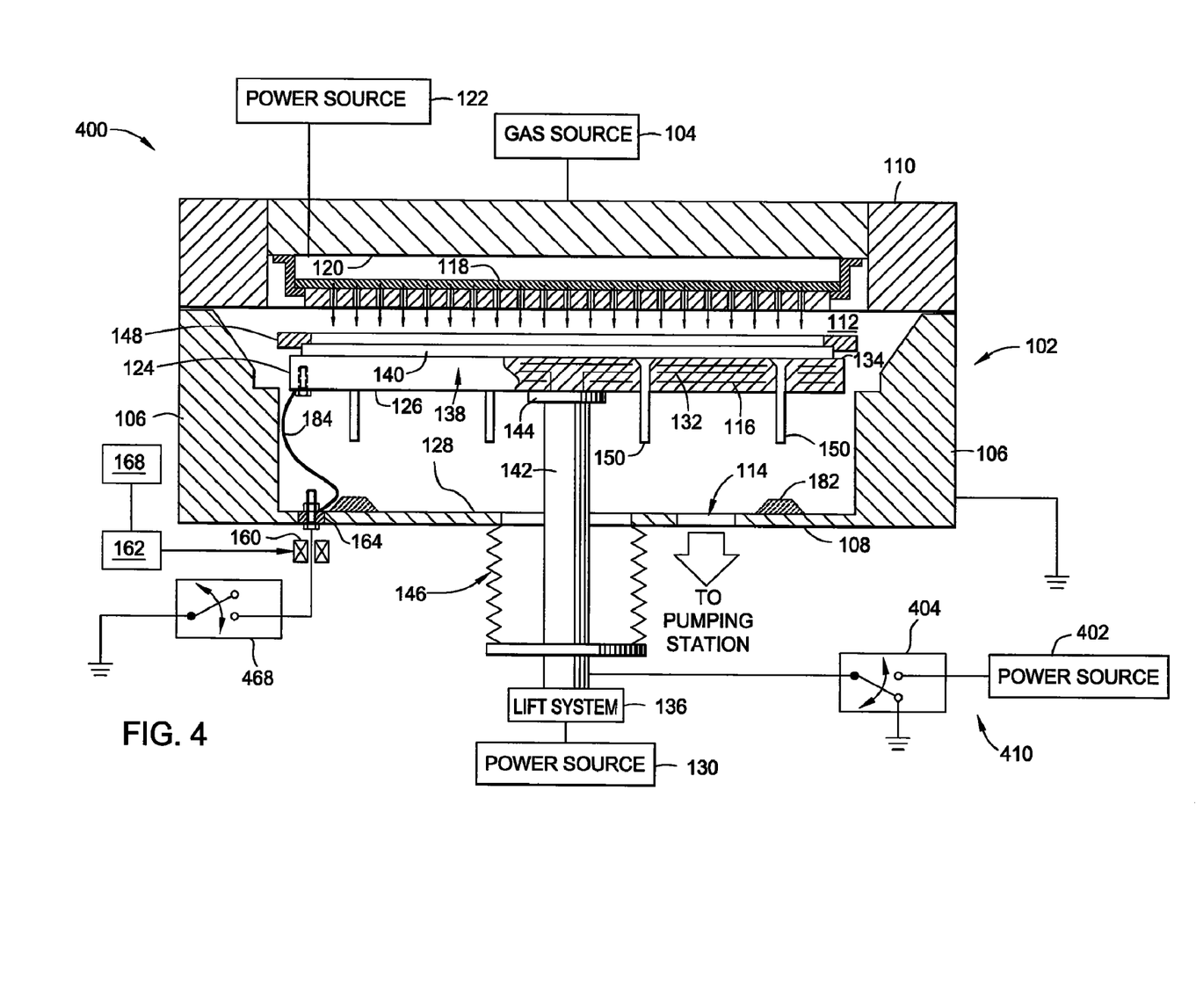
FIG. 4 is a cross sectional view of another embodiment of a plasma enhanced chemical vapor deposition system having a dechucking circuit.

FIG. 4 depicts another embodiment of a processing system 400 having one or more ground path integrity sensors 160. The system 400 generally includes a process chamber body 102 coupled to a power source 122 and a gas source 104, as described above. The ground path integrity sensors 160 interface with ground path member 184 are described above.

A dechucking circuit 410 is coupled to the substrate support assembly 138 to facilitate dechucking of the substrate from the substrate support assembly (i.e., to overcome the static attraction between the substrate and substrate support assembly that may be generated during substrate processing, for example, during plasma processing of the substrate). The dechucking circuit 410 includes a power source 402 and switch 404 configured to provide a signal to the substrate support assembly 138 to remove or reduce the static attraction between the substrate 140 and substrate support assembly 138. The switch 404 that selectively connects the substrate support assembly 138 to ground during processing, and to the power source 404 when dechucking of the substrate 140 is desired.

The signal provided by the power source 402 may be RF or DC, and may be a steady state or pulsed signal. The magnitude, duration and/or number of pulses of the signal produced by the dechucking circuit 410 are generally commensurate with the amount of static attraction between the substrate support assembly 138 and substrate 140 which must be overcome. The static force is typically dependent on the size of the substrate, the materials deposited on the substrate, and processing parameters, such as plasma power during processing and materials comprising the substrate support, among others.

In embodiments where the substrate support assembly 138 is grounded by one or more RF ground return path members 184, the electrical signal provided by the power source 402 may be configured to cause to RF ground return path members 184 (selected with a sufficiently high impedance) to become inductively open, thereby isolating the support assembly 138 from ground. For example, a pulsed DC or RF signal may be selected so that substantially no current flows through the RF ground return path members 184 during application of the dechucking signal to the substrate support assembly 138.

In the embodiment depicted in FIG. 4, the RF ground return path members 184 is isolated from the chamber body 102 by an insulator 464 and coupled to ground through a switch 468. The switch 468 may be operated to selectively couple the substrate support assembly 138 to ground during processing, and to open the circuit between the substrate support assembly 138 and ground during dechucking (i.e., when power is applied by the power source 402 to the support assembly 138). During processing when the switch couples the substrate support assembly 138 to ground, the ground path integrity sensors 160 provides the controller 168 with a metric indicative of current passing through the ground path members 184.

Figure 5:
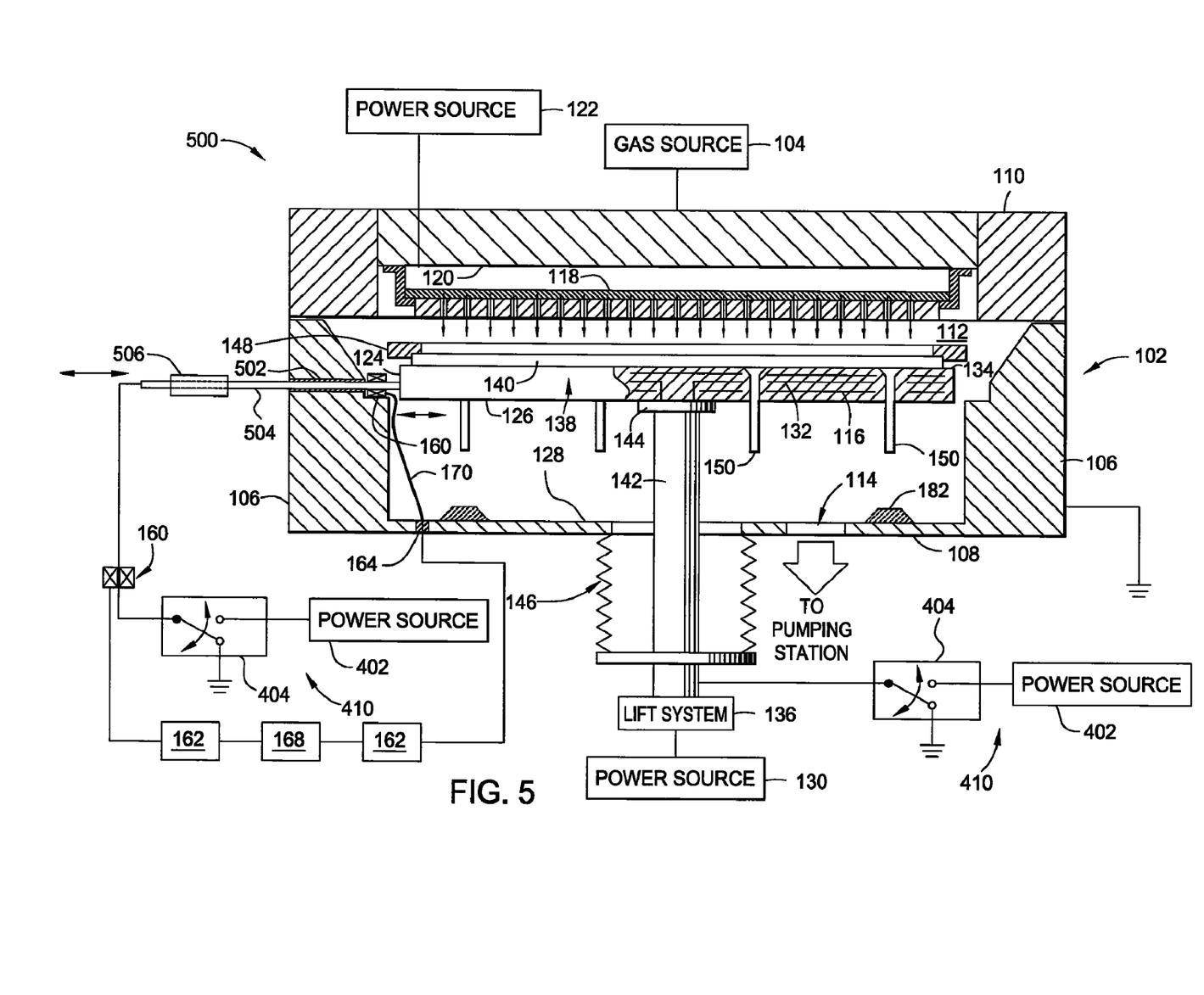
FIG. 5 is a cross sectional view of another embodiment of a plasma enhanced chemical vapor deposition system having a dechucking circuit.

FIG. 5 depicts is a cross sectional view of another embodiment of a plasma enhanced chemical vapor deposition system 500 having one or more ground path integrity sensors 160. The system 500 is configured similar to the systems 100, 400 described above, except wherein the substrate support assembly 138 is grounded by one or more ground members 504. A dechucking circuit 410 may by utilized to selectively couple a power source 462 to the substrate support assembly 138 through a switch 462, as described above to facilitate dechucking of the substrate. Power from the dechucking circuit 410 may be applied through the member 504 and/or the shaft 142.

The ground member 504 is moveable between a position contacting the substrate support assembly 138 during processing, as shown in FIG. 5, and a position clear of the substrate support assembly 138 during dechucking of the substrate 140. The ground member 504 is isolated from the side walls 106 of the chamber body 102 by an isolator 502. An actuator 506 interacts with the ground member 504 to control the displacement of the ground member 504. The actuator 506 may be a solenoid linear actuator, pneumatic or hydraulic cylinder or other device suitable to move the ground member 504 into and out of contact with the substrate support assembly 138.

The ground path integrity sensor 160 is configured to detect a metric indicative of current passing between ground and the substrate support assembly 138 through the ground member 504. In one embodiment, the ground path integrity sensor 160 may be disposed around the ground member 504, either inside or outside the chamber body 102. In another embodiment, the ground path integrity sensor 160 interface with the leads coupling the ground member 504 to ground outside the chamber body 102.

Thus, a method and apparatus has been provided for facilitating monitoring the grounding a substrate support assembly using a ground path integrity sensor. Advantageously, the ground path integrity sensor allows for the characterization of the grounding conditions during processing, thereby alerting operators to conditions that may require maintenance without interrupting processing or requiring chamber down time.

While the foregoing is directed to the preferred embodiment of the present invention, other and further embodiments of the invention may be devised without departing from the basic scope thereof, and the scope thereof is determined by the claims that follow.

What is claimed is:

1. A processing chamber, comprising:
a chamber body having a process volume;
a substrate support disposed in the process volume of the chamber body;
a ground path member electrically coupling the substrate support to the chamber body;
a sensor comprising a coil positioned in the process volume of the chamber body and operable to sense a metric indicative of current passing through the ground path member; and
a sensor lead coupling the sensor to a vacuum feed through.

2. The processing chamber of claim 1, wherein the ground path member further comprises a flexible strap.

3. The processing chamber of claim 2, wherein the ground path member further comprises aluminum.

4. The processing chamber of claim 1, wherein the ground path member further comprises:
a bar movable between a first position spaced from the substrate support and a second position in contact with the substrate support.

5. The processing chamber of claim 1, wherein the sensor further comprises:
a current sensor.

6. The apparatus of claim 1 further comprising:
a controller operable to determining if a total number of functioning ground path members is above a threshold and/or if a relative position of remaining functioning ground path members to each other is within a threshold.

7. The processing chamber of claim 1, wherein the sensor further comprises a dielectric ring, and the coil is wound around the dielectric ring.

8. The processing chamber of claim 7, wherein the ground path member passes through a center of the sensor.

9. The processing chamber of claim 1, wherein the sensor lead is coupled to the coil.

10. A processing chamber, comprising:
a chamber body having a process volume;
a substrate support disposed in the process volume of the chamber body;
a plurality of ground straps coupled between a perimeter of the substrate support and the chamber body; and
a plurality of sensors, each sensor comprising a coil positioned within the process volume of chamber body and operable to sense a metric indicative of strap integrity for a plurality of the ground straps;
a vacuum feed through formed through the chamber body, and
a plurality of leads coupled to the plurality of sensors and passing through the vacuum feed through.

11. The processing chamber of claim 10, wherein the at least one of the sensors further comprises:
a current sensor configured to sense a metric indicative of current passing through the associated straps.

12. The processing chamber of claim 10 further comprising:
a sensing circuit coupled to the leads, the sensing circuit having an amplifier.

13. The processing chamber of claim 10 further comprising:
a sensing circuit coupled to at least one of the sensors, the sensing circuit including an amplifier.

14. The apparatus of claim 10 further comprising:
a controller operable to determining if a total number of functioning ground straps is above a threshold and/or if a relative position of remaining functioning ground straps to each other is within a threshold.

15. A method for monitoring the integrity of a ground member coupling a substrate support to a chamber body in a plasma processing chamber, comprising:
sensing current passing through the ground member using a coil positioned within the plasma processing chamber and proximate the ground member;
monitoring a metric indicative of sensed current passing through the ground member during processing; and
setting a flag if a change in the metric exceeds predefined threshold.

16. The method of claim 15 further comprising:
determining if a total number of functioning ground members is above a threshold and/or if a relative position of remaining functioning ground members to each other is within a threshold.

17. The method of claim 15, wherein setting the flag further comprises:
determining if a predefined number of ground paths are in an open circuit state.

18. The method of claim 15, wherein setting the flag further comprises:
determining if a predefined combination of ground paths are in an open circuit state.

19. The method of claim 15, wherein setting the flag further comprises:
warning an operator.

20. The method of claim 15, wherein setting the flag further comprises:
taking the plasma processing chamber out of service in response to the flag.

21. A method for processing a substrate, comprising:
plasma processing a substrate disposed on a substrate support in a vacuum processing chamber;
monitoring continuity of a plurality of ground members coupling the substrate support to ground during processing to determine if a particular ground member or group of ground members are functioning; and
determining if a total number of functioning ground members is above a threshold and/or if a relative position of remaining functioning ground members to each other is within a threshold.

22. The method of claim 21, wherein monitoring the continuity of the ground member further comprises:
sensing current passing through the ground member.

23. The method of claim 21, wherein monitoring the continuity of the ground member further comprises:
monitoring resistance of the ground member.

24. The method of claim 21 further comprising:
setting a flag when a change in the continuity of the ground member is detected.

25. The method of claim 21 further comprising:
changing a process setting in response to a change in the continuity of the ground member.

* * * * *